United States Patent
Harvey et al.

(10) Patent No.: US 6,577,127 B2
(45) Date of Patent: Jun. 10, 2003

(54) MAGNETIC RESONANCE IMAGING METHOD FOR IMAGING TIME-DEPENDENT CONTRAST

(75) Inventors: Paul Royston Harvey, Eindhoven (NL); Johan Samuel Van Den Brink, Eindhoven (NL); Romhild Martijn Hoogeveen, Eindhoven (NL); Gabriele Marianne Beck, Eindhoven (NL); Gerrit Hendrik Van Yperen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 62 days.

(21) Appl. No.: 09/817,097

(22) Filed: Mar. 26, 2001

(65) Prior Publication Data

US 2001/0033162 A1 Oct. 25, 2001

(30) Foreign Application Priority Data

Mar. 27, 2000 (EP) .............................. 00201093

(51) Int. Cl.$^7$ ................................. G01V 3/00
(52) U.S. Cl. ...................... 324/307; 324/309
(58) Field of Search .................. 324/306, 307, 324/309, 312, 300; 600/413, 509

(56) References Cited

U.S. PATENT DOCUMENTS

| 5,122,747 A | 6/1992 | Rieder et al. ............... 324/309 |
| 5,810,726 A | 9/1998 | Van Vaals et al. .......... 600/410 |
| 5,881,728 A | 3/1999 | Mistretta et al. ......... 128/653.4 |
| 6,493,569 B2 * | 12/2002 | Foo et al. .................... 600/410 |

FOREIGN PATENT DOCUMENTS

| WO | 972064 | 7/1997 | ............ A61B/5/55 |
| WO | 9914616 | 3/1999 | ......... G01R/33/561 |

\* cited by examiner

*Primary Examiner*—Edward Lefkowitz
*Assistant Examiner*—Brig B. Shrivastav
(74) *Attorney, Agent, or Firm*—John Vodopia

(57) ABSTRACT

A magnetic resonance imaging method is proposed wherein the MR signal acquisition is performed by separate scanning of central (40) and peripheral (70) sectors. Central and peripheral sectors are selected in an individual plane in the k-space and optionally an intermediate sector (50) between the peripheral and central sectors is also selected. The center (O) in the k-space in the individual plane at issue is situated within the central sector. The scanning of the k-space commences outside the center of the k-space and before or during increasing contrast. Preferably, the scanning is timed such that the center of the k-space is reached at maximum contrast (MR angiography) or at the value zero of the longitudinal magnetization (MR inversion recovery). The central sector is advantageously scanned in a stochastic order. The peripheral sector may be scanned along a spiral-shaped trajectory, radial trajectories or along high-low ordered lines.

15 Claims, 2 Drawing Sheets

MAGNETIC RESONANCE IMAGING METHOD FOR IMAGING TIME-DEPENDENT CONTRAST

PRIORITY CLAIM

This application claims priority from European Patent Application Serial No. 00201093.2, filed on Mar. 27, 2000.

BACKGROUND OF THE INVENTION

1. Field of the Invention

The invention relates to a magnetic resonance imaging method for imaging a time-dependent contrast with a section that increases in time and in which one or more k-planes in the k-space are scanned by the reception of magnetic resonance signals. The invention also relates to a magnetic resonance imaging system.

2. Description of the Related Art

A magnetic resonance imaging method and a magnetic resonance imaging system of this kind are known from United States patent specification U.S. Pat. No. 5,122,747.

During the execution of magnetic resonance imaging methods the object to be examined, for example the patient to be examined, is arranged in a steady magnetic field and (nuclear) spins are excited in the patient to be examined by means of RF excitation. Magnetic resonance signals are emitted upon relaxation of the (nuclear) spins. Spatial encoding of the magnetic resonance signals is realized by application of temporary magnetic gradients, also referred to as gradient fields, and a magnetic resonance image is reconstructed from the magnetic resonance signals on the basis of said spatial encoding.

In the case of MR angiography the patient to be examined is injected with a contrast medium that produces strong magnetic resonance signals, for example after excitation by means of a radio frequency (RF) pulse. The magnetic resonance signals thus generated are used to reconstruct a magnetic resonance image in which a part of the vascular system of the patient to be examined is reproduced.

It has been found in the practice of MR angiography that when the contrast medium reaches the arteries of the patient to be examined, the contrast of the arteries filled with the contrast medium increases relative to the surrounding tissue. This means that there is a time-dependent contrast with an increasing section. When a given period of time has elapsed after the contrast medium has reached the arteries, the variation of the concentration of contrast medium in the arteries is only slow as a function of time, and hence also the variation of the strength of the magnetic resonance signals from the arteries. It has notably been found that after the contrast medium has reached the arteries, the concentration of contrast medium in the arteries (the arterial contrast) first increases quickly and subsequently its increase is significantly slower until it reaches a maximum value, after which it decreases very slowly again. Approximately from 4 to 8 seconds after the maximum contrast has occurred in the arteries, however, considerable so-called venous enhancement starts to appear in the magnetic resonance images because the contrast medium has meanwhile reached the veins. The period of time of from 4 to 8 seconds between the maximum of the arterial contrast and the beginning of the considerable venous enhancement is also referred to as the arterial window.

According to the known method individual planes in the k-space are scanned along an essentially spiral-shaped trajectory. The spiral-shaped trajectory starts at the center in the k-space in the relevant plane and extends outwards therefrom in the form of a spiral. The individual plane is usually a $(k_y, k_z)$ plane, in which case the center of said plane is formed by the point $(k_y, k_z) = (0,0)$. One or more magnetic resonance images are reconstructed from the magnetic resonance signals acquired during the scanning of the k-space; for example, a magnetic resonance image of a section along a plane through the patient to be examined is reconstructed for each of the individual planes in the k-space. The known method is used notably in magnetic resonance angiography. The magnetic resonance signals from the blood vessels are very weak prior to the injection with a contrast medium. When the injected contrast medium reaches the arteries, the strength of the magnetic resonance signals from the arteries increases very quickly and in a somewhat later stage the variations in time of the magnetic resonance signals from the arteries are much smaller. Finally, the contrast medium also reaches the veins of the patient to be examined and magnetic resonance signals of considerable strength emanate from the veins. The time-dependent contrast concerns the contrast in the magnetic resonance images that is due to the temporally varying concentration of contrast medium in the vascular system of the patient to be examined. The known magnetic resonance imaging method attempts to form a magnetic resonance image of high diagnostic quality of the arteries of the patient to be examined. Because the magnetic resonance signals are acquired along the spiral-shaped trajectory, the magnetic resonance signals can be acquired with a low magnitude of the wave number (low k values) before the contrast medium reaches the veins. The appearance of so-called venous enhancement in the magnetic resonance images is thus avoided.

For the known method it is notably necessary that the instant at which the acquisition of magnetic resonance signals commences at the center of the relevant k-plane corresponds very accurately to the instant at which the contrast medium reaches its maximum concentration in the arteries; in other words, the scanning along the spiral should commence at the instant at which the contrast medium reaches the arteries. Notably when the scanning along the spiral commences too early, that is, before the contrast medium has reached the arteries, so-called "ringing" artifacts occur. It has been found that when the known method is used in practice, the radiologist often commences the scanning along the spiral only well after the contrast medium has reached the arteries, thus avoiding said "ringing" artifacts. Because scanning is started only late, the magnetic resonance signals are then acquired while the concentration of the contrast medium in the arteries already decreases. Consequently, the contrast resolution of the reproduction of the arteries in the magnetic resonance image is lower or even a higher concentration of contrast medium may be required. Moreover, time is thus lost for the acquisition of magnetic resonance signals at low k values prior to the start of the venous enhancement.

SUMMARY OF THE INVENTION

It is an object of the invention to provide a magnetic resonance imaging method which enables faithful reproduction of the time-dependent contrast in the magnetic resonance images and is much less sensitive to the accuracy of the "timing" of the acquisition of the magnetic resonance signals. The invention is used preferably for the imaging of a time-dependent contrast with a slowly varying section.

This object is achieved by means of a magnetic resonance imaging method in accordance with the invention wherein a central sector of the k-space and a peripheral sector of the k-space are selected in advance in an individual k-plane, and the peripheral sector is scanned separately from the scanning of the central sector, the central sector contains the center of the individual k-plane, and the center of the individual k-plane is situated outside the peripheral sector, where the scanning of the central sector commences outside the center of the individual k-plane and before or during the increasing section of the time-dependent contrast.

In accordance with the invention the scanning of the central sector commences outside the center, that is, preferably before the increase of the arterial contrast. Consequently, more time is available for the scanning of the central sector prior to the start of the venous enhancement. The invention also utilizes the fact that in practical MR angiography the time-dependent contrast has a section which varies slowly in time as from an instant just before the contrast in the arteries becomes maximum and the start of the venous enhancement. Because the central sector is scanned separately in accordance with the invention, the center can be easily scanned during the slowly varying section. For example, the peripheral sector is scanned after the scanning of the central sector. When the scanning of the central sector is started outside the center, it can easily be avoided that the scanning of the center takes place exactly when the contrast increases quickly. Preferably, the central sector is scanned while ensuring that the center of the k-space is reached approximately simultaneously with the occurrence of the maximum arterial contrast; however, the scanning may commence before the arterial contrast is maximum. During the scanning of a part of the k-space, such as the central and peripheral sectors, magnetic resonance signals with a wave vector are sampled in the relevant part of the k-space. Because the central sector, and notably the center of the k-space, is scanned while the arterial contrast varies only slowly, no or hardly any "ringing" artifacts will occur in the magnetic resonance images. Moreover, the period of time available for scanning the central sector is longer, that is, up to about twice as long, than the duration of the arterial window. Furthermore, the arterial contrast is intensified in that the maximum of the concentration of the contrast medium in the arteries occurs during the scanning of the central sector.

The invention is particularly suitable for use in conjunction with a three-dimensional magnetic resonance imaging method such as, for example, 3D FFE (Fast Field Echo). During such an FFE sequence magnetic resonance signals are generated by exciting spins in the object to be examined, for example a patient to be examined, by means of an RF pulse which rotates the spins through a given flip angle relative to the steady magnetic field. Successive gradient echoes are then generated by application of a read-out gradient and by application of mutually perpendicular phase encoding gradients in the direction perpendicular to the read-out gradient. The individual plane in the k-space in which the central sector is selected preferably extends perpendicularly to the read-out gradient. For example, the read-out direction in the k-space is the $k_x$ direction and the individual plane with the central and peripheral sectors extends in the $(k_y, k_z)$ direction. The individual plane in the k-space is scanned at a comparatively slow speed, that is, relative to the sampling rate along the normal to the relevant individual plane in the k-space, that is, the read-out direction $k_x$. Thus, at individual points in the individual plane $(k_y, k_z)$ each time a large number of points is scanned on a line or line segment in the read-out direction $(k_x)$.

The scanning or sampling of the central sector constitutes effective filtering in respect of the wave number (or the wavelength) of the magnetic resonance signals; this is because the magnetic resonance signals acquired in the central sector of the k-space constitute a component with a given range of wave numbers of the totality of magnetic resonance signals generated, as determined by the choice of the central sector. The central sector and the peripheral sector are scanned in such a manner that the effective filtering in the individual sectors is different. The scanning of the central sector during the arterial contrast on the one hand corresponds to the application of a bandpass filter to the arterial contrast in the k-space. On the other hand, the scanning of the central sector prior to the venous enhancement corresponds to the application of a band stop filter to the venous contrast. The scanning of the peripheral sector during the venous contrast comes down to the application of a high-pass filter to the venous and the arterial contrast in the k-space. It has been found in accordance with the invention that in the presence of major changes in the degree of filtering during the scanning of the central sector the degree of contrast does not change or only hardly so. Consequently, the filtering due to the scanning of the central sector does not give rise to artifacts in the reconstructed magnetic resonance images. In other words: in conformity with the invention the arterial contrast is sampled with a comparatively wide band pass filter (for example, in comparison with the known sampling along a spiral trajectory) in the central sector of the k-space. Moreover, as a result of the scanning of the central sector during the slowly varying section, the effective wide band pass filter has a uniform response curve. Outside the passband the band pass filter has slightly descending edges. As a result, the spatial widening of the effectively filtered arterial contrast is only slight. The arterial contrast is thus reproduced with a high spatial resolution in the magnetic resonance image. This means that small details are faithfully reproduced in the magnetic resonance image. The smallest details that can be faithfully reproduced have dimensions of from 1 to 2 mm or less. The venous contrast at low k values is suppressed by a wide effective band stop filter. The suppression of the venous contrast is notably better than in the case of the known magnetic resonance imaging method.

The magnetic resonance imaging method in accordance with the invention can also be successfully used in situations involving a time-dependent contrast that is due to phenomena other than the injection of contrast medium. For example, time-dependent contrast is involved when the (nuclear) spins are saturated in a part of the object to be examined. Another example is the suppression of lipids by means of a lipid-selective saturation prepulse. For example, such a saturation is realized by means of a strong RF excitation in co-operation with a magnetic selection gradient. As a result of such saturation, no or hardly any magnetic resonance signals are produced by the relevant saturated region so that the effect of such a saturated region can be excluded from or counteracted in the magnetic resonance image. It has been found that after saturation the relevant region still produces magnetic resonance signals which increase in time and cause a time-dependent contrast. In accordance with the invention the disturbing effects of this unintentional time-dependent contrast can be mitigated. Consequently it is not, or only less often, necessary to saturate the relevant region again.

The time-dependent contrast also occurs in another example when so-called inversion recovery techniques are used such as, for example "black blood" magnetic resonance images which are formed by means of, for example, turbo spin echo techniques with a plurality of RF excitations. In that case, moreover, it is attractive to scan the peripheral sector first and to scan subsequently the central sector when the contrast arises; in this case it is preferably also ensured that the center of the k-space in the central sector is scanned as soon as the (anticipated) zero-crossing of the longitudinal magnetization component occurs upon inversion recovery. The longitudinal direction is the direction of the steady magnetic field.

These and other aspects of the invention will be further elaborated on the basis of the following embodiments which are defined in the dependent claims.

Preferably, the peripheral sector in the k-space is scanned along a trajectory that, in at least a part of the peripheral sector, progresses faster to positions of high magnitude of the k values than during the scanning of the central sector. The magnitude of the wave vector in the peripheral sector preferably increases faster on average across the peripheral sector in comparison with the average increase of the magnitude of the wave vector across the central sector. Consequently, the scanning of the peripheral sector requires a comparatively short period of time, so that more time is available for the scanning of the central sector. When during the scanning of the peripheral sector the magnitude of the wave vector increases faster across the entire peripheral sector, for example, on average, in comparison with the increase of the wave vector in the central sector during the scanning of the central sector, a particularly large amount of time will be available for the scanning of the central sector. As more time is available for the scanning of the central sector, a larger central sector may have been completely sampled already before venous enhancement occurs. It is thus achieved that the arterial window is thoroughly used for scanning the central sector within this window. The central sector relates to magnetic resonance signals having a low wave number. The magnetic resonance signals in the central sector, therefore, relate to comparatively coarse spatial details, such as the arteries filled with contrast medium. Because the central sector is scanned within the arterial window, disturbances induced by magnetic resonance signals from veins filled with contrast medium can be avoided. The disturbing of the reproduction of the arteries by venous enhancement is thus avoided. It is counteracted notably that a part of the arteries in the magnetic resonance images would be obscured from view by reproduction of veins filled with contrast medium. The peripheral sector relates to magnetic resonance signals having a comparatively high wave number. These magnetic resonance signals relate to comparatively small spatial details. The magnetic resonance signals from the peripheral sector also relate to veins filled with the contrast medium but, because only rather fine spatial details are concerned, the arteries filled with the contrast medium are still faithfully reproduced. In other words, the scanning of the peripheral sector enables accurate reproduction of small details of the arteries and the veins and, because the central sector is separately scanned, venous enhancement of the rendition of the arteries is effectively suppressed in the angiographic magnetic resonance image.

Preferably, the central sector in the k-space is scanned along parallel line segments. This method of scanning can be readily implemented on the basis of temporary, for example phase encoding gradients that are superposed on the steady magnetic field. Preferably, the central sector in the relevant plane in the k-space is scanned along line segments that extend in parallel in the k-space. One of these line segments extends through the center of the relevant plane in the k-space. When scanning takes place along line segments through the central sector during the slowly varying section of the time-dependent contrast, the magnetic resonance signals in positions neighboring one another in the k-space can be sampled very well without the occurrence of changes in the arterial contrast in the mean time. In order to save time during the scanning of the central sector, neighboring line segments in the central sector can be scanned in opposite directions.

In a further advantageous implementation of the invention the central sector is scanned in a stochastic order. The order of the positions in the k-space in which the magnetic resonance signals are acquired is then controlled on the basis of a random number, so on the basis of chance. Such stochasticity relates only to the order in which the magnetic resonance signals are acquired from the central sector. As a result, the magnetic resonance image can be reconstructed in conformity with a customary Fourier transformation. It has been found that due to the stochastic order of scanning of the central sector notably contributions to the magnetic resonance signals that could contribute to artifacts in the reconstruction of the magnetic resonance image are distributed in such a manner that artifacts are counteracted in the magnetic resonance image. Moreover, it has been found that the stochastic acquisition order makes the magnetic resonance imaging method far less sensitive to the accuracy of the timing for the scanning of the center of the k-space with respect to the fast increase of the contrast. It has even be found that hardly any noticeable artifacts occur in the case of stochastic acquisition when by chance the point $k_{y=}0, k_{z=}0$ is scanned as the first point after all in the actual realization.

When a separate intermediate sector is used between the central sector and peripheral sector, it is advantageous to scan the intermediate sector in a stochastic order.

Various strategies are feasible for the scanning of the peripheral sector. For example, the peripheral sector can be scanned along successive parallel lines through the relevant plane in the k-space. During the scanning of a next line the value of one component of the wave vector (for example, $k_y$) is alternately incremented and decremented relative to the instantaneous value. This strategy is also referred to as "low-high" scanning. Because the line segments extending through the central sector are skipped during the scanning of the parallel lines, only a short period of time will be required for scanning the lines in the peripheral sector that also extend through the central sector, so that during the scanning of the peripheral sector it is still possible to reach quickly regions of high magnitude of the wave vector for sampling. Furthermore, the "low-high" strategy offers the advantage of a reduced risk of missing of small details of the arteries that are represented by magnetic resonance signals having a wave number of high magnitude in comparison with the dimension of the central sector.

Other strategies consist in the scanning of the peripheral sector along spiral-shaped or radial trajectories. When the peripheral sector is scanned along such a spiral-shaped trajectory or along radial trajectories, regions with high values of the magnitude of the wave vector can be reached after a short period of time already, so that venous enhancement has not yet occurred when the regions nearer to the center of the k-space in the relevant plane in the k-space are sampled.

In a particularly advantageous implementation of the invention the scanning of the peripheral sector in the individual plane in the k-space is limited to k values with a maximum or a minimum component at the most or at least, respectively, equal to the value of this component in the central sector. For example, in the $k_y$ direction scanning takes place up to the maximum $k_y$ component in the central sector. Consequently, less time is required for the scanning of the peripheral sector and more time is available for the scanning of the central sector before the venous enhancement commences. The time necessary for scanning the peripheral sector can also be reduced by limiting the scanning in the $k_z$ directions and possibly also in the $k_x$ directions.

When scanning is limited in several directions, less time will be required for the scanning of the peripheral sector. It has been found that for the various strategies for scanning the peripheral sector it is advantageous to limit the scanning in one or more directions. Notably for the scanning along a spiral-shaped trajectory it is attractive to limit the trajectory in one or more directions; scanning then takes place along a spiral wherefrom parts have been cut off. Because only a part of the individual plane in the k-space is scanned, it will be necessary to use a partial Fourier reconstruction that is known per se for the reconstruction of the magnetic resonance image. Magnetic resonance signals for the parts of the individual plane in the k-space that have not been scanned are then derived, for example, by hermitic conjugation of magnetic resonance signals that have been measured.

It is also possible to select an additional intermediate sector between the central sector and the peripheral sector. The scanning of such an intermediate sector is independent of the scanning of the central and peripheral sectors. Thus, an additional possibility is created for varying the scanning of the individual k-plane. For example, first the central sector is scanned and subsequently the intermediate sector and finally the peripheral sector, but the reverse order is also feasible. Notably different methods of scanning are used in the intermediate sector and in the peripheral sector; the intermediate sector is scanned possibly in the same way as the central sector. When the central sector is scanned along parallel line segments, it is advantageous to scan the intermediate sector also along preferably parallel line segments, for as long as time is still available in the arterial window. The intermediate sector can also be scanned, for example, independently of the peripheral sector, radially or along a spiral-shaped trajectory. As more intermediate sectors are used, the possibilities for varying the scanning are further increased.

The central sector in the k-space in a preferred implementation of the invention has an anisotropic shape. This means that in one or more directions the central sector extends further into the k-space, in comparison with the magnitude of the central sector, than in other directions. Particularly favorable results are obtained when the central sector has an elongate shape. Such an elongate central sector has a major axis extending in the direction in which the central sector has its largest dimension in the k-space, and also a minor axis that extends, for example, transversely of the major axis. For example, the minor axis extends in the direction in which the central sector has its smallest dimension. Preferably, the major axis of the central sector extends in a direction in the k-space which corresponds to the direction transversely of the direction in the object along which the most important structures in the object to be examined are oriented. The magnetic resonance signals actually represent a Fourier transformed image of the object. For example, when the most important structures of the object are oriented along the x axis, the magnetic resonance signals in the k-space have high magnitudes predominantly along the $k_y$ axis. It is mainly in the case of MR angiography that the major axis is oriented in a direction that corresponds to the direction transversely of the direction of the arteries of the patient to be examined. When such an anisotropic central sector is used, structures situated in the direction transversely of the direction of the main structures are effectively suppressed in the magnetic resonance image and the contrast of the oriented main structure is intensified. Notably the major axis of the central sector is adjusted so as to extend in the direction corresponding to the direction transversely of the arteries in, for example, the neck of the patient to be examined. The venous signal is thus effectively suppressed in the vicinity of the carotid arteries of the patient to be examined.

Preferably, an exploratory magnetic resonance image is formed prior to the acquisition of the magnetic resonance signals from the central sector. For example, such an exploratory magnetic resonance image is formed on the basis of magnetic resonance signals from a very thick slice of the patient to be examined. Such an exploratory magnetic resonance image shows a projection transversely of the thick slice of a part of the patient to be examined. The exploratory magnetic resonance image reveals the direction in which the structures in the patient to be examined extend predominantly. The major axis of the central sector in the k-space can be accurately adjusted on the basis of the direction of the structures as derived from the exploratory magnetic resonance image. For example, for the exploratory magnetic resonance image a magnetic resonance image is formed of a thick slice containing the neck of the patient to be examined. Such an exploratory magnetic resonance image of the legs of the patient shows the principal direction of the carotid arteries in the neck. When the major axis of the central sector is positioned in conformity with the direction transversely of the carotid arteries in the neck, magnetic resonance signals from the veins will be suppressed. to a significant degree. Such suppression occurs because the veins extend in the direction of the arteries to a considerably lesser extent.

It is also possible to derive the direction of the structures to be suppressed from the exploratory magnetic resonance image and to position the minor axis of the central sector in the direction corresponding to that of the structures to be suppressed. It has been found that the structures to be suppressed, for example the veins, are thus effectively suppressed again in the magnetic resonance image.

Independently of the steps proposed by the invention so as to scan a separate central sector in the k-space, it is attractive to perform the scanning of the k-space anisotropically. For example, a region in the k-space having an anisotropic shape is then scanned; an anisotropic region of this kind has its largest dimension along the major axis. It is also possible to scan a larger number of points in a region in the k-space extending along the major axis and/or to select a distance between neighboring scanned points in the direction of the major axis which is smaller than the distance between points scanned in the direction transversely of the major axis. Anisotropic scanning of the k-space is thus realized. The magnetic resonance image is then reconstructed from the magnetic resonance signals with wave vectors in the anisotropic and/or possibly anisotropically shaped region in the k-space.

Furthermore, it is advantageous to utilize sub-sampling of the magnetic resonance signals during the scanning of notably the central sector and/or the intermediate sector, if any, and to reconstruct the magnetic resonance image also on the basis of coil sensitivity profiles of the receiving antennas such as receiving coils. Application of sub-sampling reduces the number of magnetic resonance signals to be acquired since parts, for example lines, in the k-space are then "skipped" as if it were. Consequently, less time will be required for scanning the central sector so that a larger central sector can be scanned within the same period of time. This results in enhanced venous suppression while the robustness as regards the "timing" of the acquisition is also enhanced. It is notably advantageous to scan the central sector while utilizing the so-called SENSE technique which is known per se from the article "Coil sensitivity for fast MRI" by K. P. Pruessman et al. in Proceedings ISMRM (1998), 579. The central sector can also be scanned, for example, by means of the so-called SMASH technique which is known per se from U.S. Pat. No. 5,910,728.

Moreover, it has been found that favorable results are obtained for the magnetic resonance image by applying the invention in combination with well known steps for the suppression of magnetic resonance signals from lipid tissue, for example, the use of spatially/spectrally selective RF excitation pulses.

The invention also relates to a magnetic resonance imaging system suitable for carrying out the magnetic resonance imaging method according to the invention. A magnetic resonance imaging system according to the invention is defined in the independent claim 14.

The magnetic resonance imaging system according to the invention includes a control unit with a computer provided with a (micro)processor for controlling the temporary gradient fields and RF excitations. The functions of a magnetic resonance imaging system in accordance with the invention are carried out preferably by means of a suitably programmed computer or (micro) processor or a special purpose processor provided with integrated electronic or optoelectronic circuits especially designed for carrying out one or more of the magnetic resonance imaging methods in accordance with the invention.

The invention also relates to a computer program with instructions for carrying out a magnetic resonance imaging method. It is a further object of the invention to provide a computer program whereby one or more of the magnetic resonance imaging methods in accordance with the invention can be carried out. A computer program in conformity with the invention is defined in the independent claim 15. When such a computer program in accordance with the invention is loaded into the computer of a magnetic resonance imaging system, one or more magnetic resonance imaging methods in accordance with the invention can be executed by means of such a magnetic resonance imaging system. For example, the technical effects necessary to produce magnetic resonance images in accordance with the invention can thus be realized on the basis of the instructions of the computer program in accordance with the invention. For example, a magnetic resonance imaging system in accordance with the invention is a magnetic resonance imaging system whose computer is loaded with a computer program in accordance with the invention. Such a computer program can be stored on a carrier such as a CD-ROM. The computer program is loaded into the computer by reading the computer program from the carrier, for example by means of a CD-ROM player, and storing it in the memory of the computer of the magnetic resonance imaging system. However, it is also possible to load the computer program in accordance with the invention into the memory of the computer of the magnetic resonance imaging system via a network, such as the worldwide web.

BRIEF DESCRIPTION OF THE DRAWINGS

These and other aspects of the invention will be described in detail hereinafter, by way of example, with reference to the following embodiments and the accompanying drawing; therein.

DETAILED DESCRIPTION OF THE PREFERRED EMBODIMENTS

Figure 1:
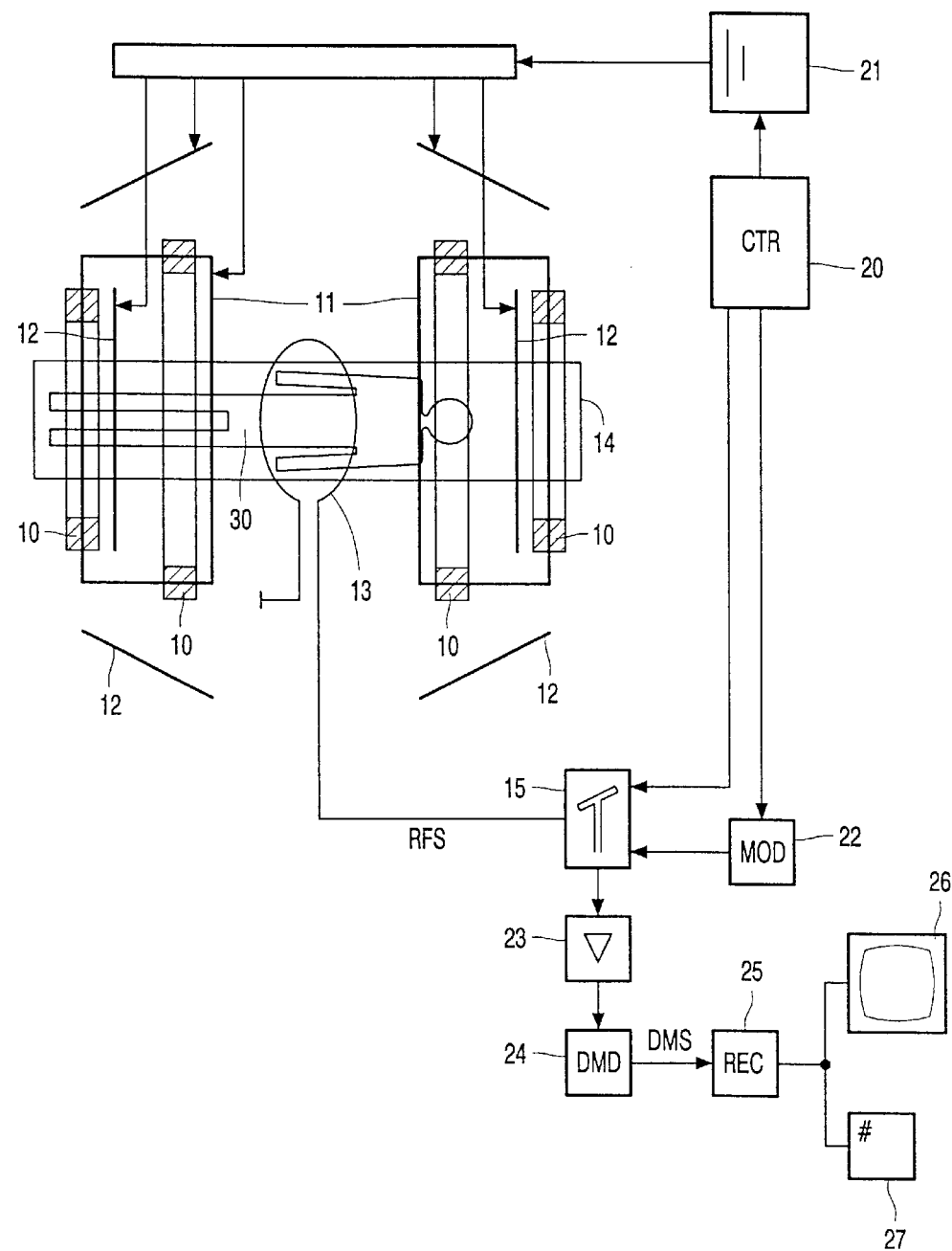
FIG. 1 shows diagrammatically a magnetic resonance imaging system in which the invention is used.

FIG. 1 shows diagrammatically a magnetic resonance imaging system in which the invention is used. The magnetic resonance imaging system includes a system of main coils 10 whereby the steady, uniform magnetic field is generated. The main coils are constructed, for example, in such a manner that they enclose a tunnel-shaped examination zone. The patient to be examined is transported into said tunnel-shaped examination zone. The magnetic resonance imaging system also includes a number of gradient coils 11, 12 whereby magnetic fields with spatial variations, notably in the form of temporary gradients in separate directions, are superposed on the uniform magnetic field. The gradient coils 11, 12 are connected to a variable power supply unit 21. The gradient coils 11, 12 are energized by applying a current thereto by means of the power supply unit 21. The strength, the direction and the duration of the gradients are controlled by control of the power supply unit. The magnetic resonance imaging system also includes transmission and receiving coils 13 for generating the RF excitation pulses and for collecting the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient 30 to be examined is situated within the body coil 13 when accommodated in the magnetic resonance imaging system. The body coil 13 acts as a transmission antenna for transmitting the RF excitation pulses and RF refocusing pulses. The body coil 13 preferably provides a spatially uniform intensity distribution of the transmitted RF pulses. Usually the same coil or antenna is used alternately as a transmission coil and as a receiving coil. Furthermore, the transmission and receiving coil is usually shaped as a coil, but other geometries where the transmission and receiving coil acts as a transmission and receiving antenna for RF electromagnetic signals are also feasible. The transmission and receiving coil 13 is connected to an electronic transceiver circuit 15.

However, it is to be noted that it is alternatively possible to use separate receiving coils. For example, surface coils can then be used as receiving coils. Such surface coils have a high sensitivity in a comparatively small volume. The transmission coils, such as the surface coils, are connected to a demodulator 24 and the magnetic resonance signals (RFS) received are demodulated by means of the demodulator 24. The demodulated magnetic resonance signals (DMS) are applied to a reconstruction unit. The receiving coil is connected to a preamplifier 23. The preamplifier 23 amplifies the RF resonance signal (RFS) received by the receiving coil and the amplified RF resonance signal is applied to a demodulator 24. The demodulator 24 demodulates the amplified RF resonance signal. The demodulated resonance signal contains the actual information concerning the local spin densities in the part of the object to be imaged. Furthermore, the transceiver and receiving circuit 15 is connected to a modulator 22. The modulator 22 and the transceiver circuit 15 activate the transmission coil 13 so as to transmit the RF excitation and refocusing pulses. The reconstruction unit derives one or more image signals from the demodulated magnetic resonance signals (DMS); such image signals represent the image information of the imaged part of the object to be examined. In practice the reconstruction unit 25 is preferably constructed as a digital image processing unit 25 which is programmed to derive from the demodulated magnetic resonance signals the image signals that represent the image information of the part of the object to be imaged. The signal at the output of the reconstruction unit is applied to a monitor 26 so that the magnetic resonance image can be displayed on the monitor. It is also possible for the magnetic resonance signals to represent a three-dimensional density distribution. Such a three-dimensional density distribution can be displayed on the monitor in various ways; for example, projections to be selected by the user are reproduced or stereoscopic pairs of images are displayed. It is alternatively possible to store the signal from the reconstruction unit in a buffer unit 27 while awaiting further processing.

The magnetic resonance imaging system in accordance with the invention also includes a control unit 20, for example, in the form of a computer with a (micro) processor. The control unit 20 controls the execution of the RF excitations and the application of the temporary gradient fields. To this end, for example, the computer program in accordance with the invention is loaded into the control unit 20.

Figure 2:
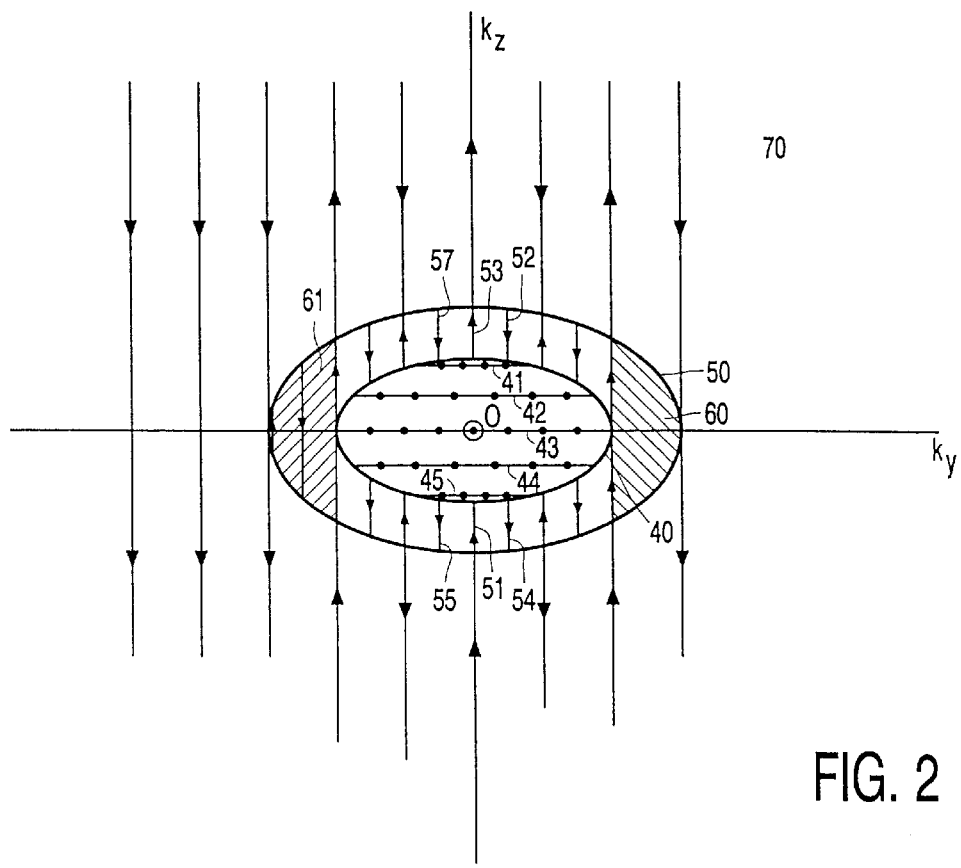
FIG. 2 shows graphically an example of an acquisition trajectory through the k-space that is used in accordance with the invention.

FIG. 2 shows graphically an example of an acquisition trajectory through the k-space that is used in accordance with the invention. FIG. 2 notably shows such an acquisition trajectory in the ($k_y$, $k_z$) plane. In the central sector 40 points are scanned on a number of line segments 41, 42, 43, 44, 45. Scanning commences, for example, at the edge of the central sector; for example, first the line segment 41 is scanned and after some time the center (O) of the ($k_y$, $k_z$) plane on the line segment 43 is scanned. After completion of the scanning of the central sector, the intermediate sector 50 is scanned in conformity with a so-called high-low strategy. First the line segments 51, 53 at $k_y=0$ are scanned while $k_z$ increases. Subsequently, as $k_z$ decreases the line segments 52, 54 are scanned with a positive $k_y$ and subsequently the line segments 55, 57 are scanned with an increasing $k_z$. Thus, line segments are scanned alternately with positive and negative $k_y$ and an increasing and decreasing $k_z$. In order to save time, it is advantageous to refrain from scanning a part 60 of the intermediate sector with $k_y$ larger than the maximum $k_y$ in the central sector. The magnetic resonance signals having a wave number in the part 60 can be derived, for example by hermitic conjugation, from the magnetic resonance signals from a part 61 of the intermediate sector which is point-mirrored in the point O relative to the unscanned part 60 of the intermediate sector. Finally, the peripheral sector 70 is scanned, that is, again in conformity with a high-low strategy as already explained for the intermediate sector. The peripheral sector is scanned for $k_y$ values amounting to no more than the maximum $k_y$ values of the intermediate sector. The missing magnetic resonance signals can again be calculated, by way of hermitic conjugation, from magnetic resonance signals in positions that are point-mirrored relative to the point O.

Figure 3:
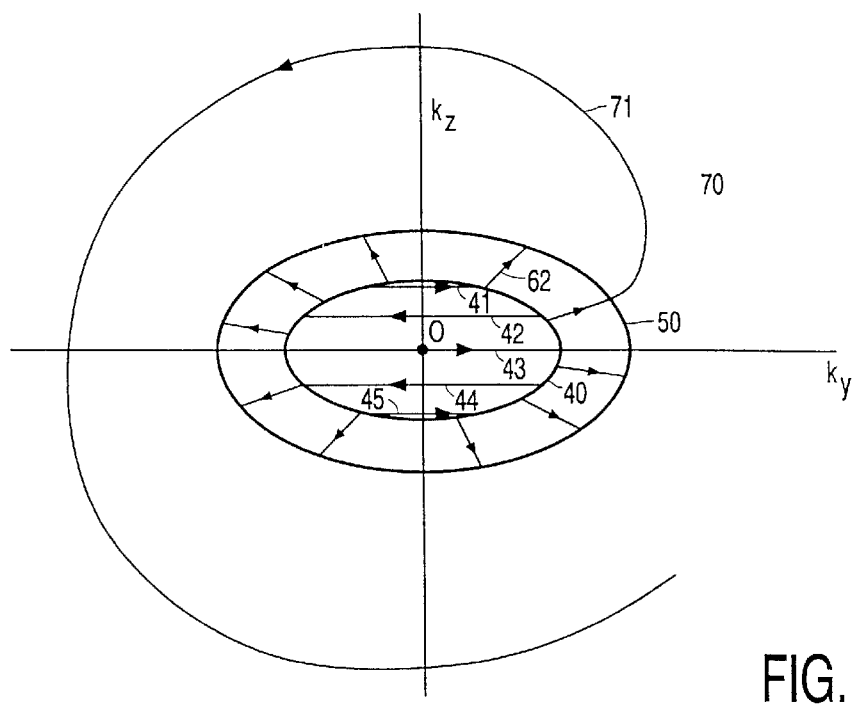
FIG. 3 shows graphically a further example of an acquisition trajectory through the k-space that is used in accordance with the invention.

FIG. 3 shows graphically a further example of an acquisition trajectory through the k-space that is used in conformity with the invention. In the example of FIG. 3 the central sector 40 is scanned along line segments 41 to 45. The intermediate sector 60 is scanned along radially oriented line segments 62, that is, line segments that are directed away from the point O, and subsequently the peripheral sector 70 is scanned along a spiral-shaped trajectory 71.

In the examples illustrated by the FIGS. 2 and 3 it is very well possible to scan the positions in the central sector, situated on preselected line segments or not, in a stochastic order.

What is claimed is:

1. A magnetic resonance imaging method for imaging using a contrast medium, comprising the steps of:
    selecting a central sector and a peripheral sector of the k-space in advance of scanning any individual k-plane, wherein the central sector contains the center of the k-space and the peripheral sector does not contain the center of the k-space;
    scanning the central sector starting from outside a center of an individual k-plane, wherein said scanning occurs before or during a time period where a signal emitted by the contrast medium is increasing to a maximum value; and
    scanning the peripheral sector separately from the scanning of the central sector.

2. The magnetic resonance imaging method as claimed in claim 1, wherein the contrast medium has a period of time when its signal slowly varies and wherein the center of the individual k-plane is scanned during the period of time in which the contrast medium's signal is slowly varying.

3. The magnetic resonance imaging method as claimed in claim 1, wherein
    the scanning of at least a part of the peripheral sector is faster on average than the scanning of a same size portion of the central sector.

4. The magnetic resonance imaging method as claimed in claim 1, wherein said step of scanning the central sector comprises:
    scanning along parallel line segments in the k-plane.

5. The magnetic resonance imaging method as claimed in claim 1, wherein said step of scanning the peripheral sector comprises one of the following steps:
    scanning straight parallel line segments, while alternating the direction of scanning, or
    scanning line segments along an essentially spiral-shaped trajectory, or
    scanning line segments along radial trajectories.

6. The magnetic resonance imaging method as claimed in claim 1, wherein the scanning of the peripheral sector is limited to $k_{a,b}$ values where either the $k_a$ or $k_b$ vector component is limited to values taken by the same $k_a$ or $k_b$ vector component in the central sector.

7. The magnetic resonance imaging method as claimed in claim 1, further comprising the steps of:
    selecting an intermediate sector in the individual k-plane between the central sector and the peripheral sector; and
    scanning the intermediate sector separately from the scanning of the peripheral sector and the central sector.

8. The magnetic resonance imaging method as claimed in claim 7, wherein said step of scanning the intermediate sector is performed in a manner similar to the scanning of the central sector.

9. The magnetic resonance imaging method as claimed in claim 7, wherein the step of scanning the intermediate sector comprises the step of:
    scanning along radial lines.

10. The magnetic resonance imaging method as claimed in claim 1, 4 or 9, wherein at least one of the central sector or the intermediate sector is scanned in a stochastic order.

11. The magnetic resonance imaging method as claimed in claim 1, wherein the central sector has an anisotropic shape and extends in the k-space along a major axis over a distance that is larger than that along a minor axis perpendicular to the major axis.

12. The magnetic resonance imaging method as claimed in claim 11, further comprising the steps of:

making an exploratory magnetic resonance image prior to said step of selecting the central sector; and deriving the anisotropic shape of the central sector, including a ratio of a dimension of the central sector in the k-space in a direction along the major axis to a dimension of the central sector in the k-space in a direction along the minor axis, from the exploratory magnetic resonance image.

13. The magnetic resonance imaging method as claimed in claim 12, wherein said step of deriving the anisotropic shape of the central sector comprises the step of:

deriving the direction of the major axis on the basis of the exploratory magnetic resonance image.

14. A magnetic resonance imaging system comprising:

means for selecting a central sector and a peripheral sector of the k-space in advance of scanning any individual k-plane, wherein the center sector contains the center of the k-space and the peripheral sector does not contain the center of the k-space;

means for scanning the center sector starting from outside a center of the k-plane, wherein said scanning occurs before or during a time period where a signal emitted by the contrast medium is increasing to a maximum value; and means for scanning the peripheral sector separately from the scanning of the central sector.

15. A computer program comprising:

instructions for selecting a central sector and a peripheral sector of the k-space in advance of scanning any individual k-plane, wherein the center sector contains the center of the k-space and the peripheral sector does not contain the center of the k-space;

instructions for scanning the center sector stating from outside a center of the k-plane, wherein said scanning occurs before or during a time period where a signal emitted by the contrast medium is increasing to a maximum value; and instructions for scanning the peripheral sector separately from the scanning of the central sector.

* * * * *